United States Patent
Barchuk (10) Patent No.: US 11,217,056 B2
(45) Date of Patent: Jan. 4, 2022

(54) SINGLE-STAGE ACTIVE INTEGRATOR WITH MULTIPLICATION OF PHOTODIODE CURRENT

(71) Applicant: Crane Payment Innovations, Inc., Malvern, PA (US)

(72) Inventor: Volodymyr Barchuk, Richmond Hill (CA)

(73) Assignee: Crane Payment Innovations, Inc., Malvern, PA (US)

( * ) Notice: Subject to any disclaimer, the term of this patent is extended or adjusted under 35 U.S.C. 154(b) by 317 days.

(21) Appl. No.: 16/475,049

(22) PCT Filed: Dec. 22, 2017

(86) PCT No.: PCT/US2017/068247
§ 371 (c)(1),
(2) Date: Jun. 28, 2019

(87) PCT Pub. No.: WO2018/217234
PCT Pub. Date: Nov. 29, 2018

(65) Prior Publication Data
US 2019/0333310 A1    Oct. 31, 2019

Related U.S. Application Data (60) Provisional application No. 62/511,899, filed on May 26, 2017.

(51) Int. Cl.
*G07F 7/04* (2006.01)
*G01J 1/46* (2006.01)
(Continued)

(52) U.S. Cl.
CPC ............... *G07F 7/04* (2013.01); *G01J 1/46* (2013.01); *G07D 5/00* (2013.01); *G07D 7/121* (2013.01);
(Continued)

(58) Field of Classification Search
CPC ............ G07F 7/04; H03F 3/08; H03K 17/785
(Continued)

(56) References Cited

U.S. PATENT DOCUMENTS 5,343,160 A * 8/1994 Taylor ..................... H03F 3/087
330/295
5,670,775 A * 9/1997 Abraham ................. G06G 7/24
250/214 A
(Continued)

OTHER PUBLICATIONS

Supplementary European Search Report dated Feb. 9, 2021 in connection with European Application No. 17910585.3, 24 pages.
(Continued)

*Primary Examiner* — Tomi Skibinski (57) ABSTRACT

An embodiment of this disclosure provides an automated payment apparatus. The apparatus includes a photodiode current integrator configured to charge an integration capacitor. The photodiode current integrator includes a first feedback resistor connected along a negative feedback path of an operational amplifier between an output of the operational amplifier and a negative input of the operational amplifier. The photodiode current integrator also includes a second feedback resistor connected along a positive feedback path of the operational amplifier between the output of the operational amplifier and a positive input of the operational amplifier. The photodiode current integrator also includes an integration capacitor connected to the positive input of the operational amplifier and to common circuit ground. The photodiode current integrator also includes a reset switch connected to the positive input of the operational amplifier and to common circuit ground or to additional voltage source. The photodiode current integrator also includes a photodiode connected to the positive input and the negative input of the operational amplifier.

20 Claims, 5 Drawing Sheets

(51) Int. Cl.
  *G07D 5/00* (2006.01)
  *G07D 7/121* (2016.01)
  *H03F 1/08* (2006.01)
  *H03F 3/08* (2006.01)
  *H03K 17/785* (2006.01)

(52) U.S. Cl.
  CPC .............. *H03F 1/08* (2013.01); *H03F 3/08* (2013.01); *H03K 17/785* (2013.01)

(58) Field of Classification Search
  USPC .............................................. 330/9; 194/206
  See application file for complete search history.

(56) References Cited

U.S. PATENT DOCUMENTS

| | | | |
|---|---|---|---|
| 5,767,538 A | 6/1998 | Mullins et al. | |
| 5,982,232 A * | 11/1999 | Rogers | H03F 3/087 330/308 |
| 7,288,754 B2 * | 10/2007 | Tsai | H04B 10/6973 250/214 A |
| 7,403,065 B1 * | 7/2008 | Gresham | H03F 1/08 330/308 |
| 2001/0050333 A1 * | 12/2001 | Feng | H03F 3/087 250/214 A |
| 2013/0154483 A1 * | 6/2013 | Hagan | H05B 45/14 315/122 |
| 2014/0192360 A1 * | 7/2014 | Atzler | G01J 1/46 356/432 |

OTHER PUBLICATIONS

Schnatterly, et al., "Position Sensitive Solid State Detectors," Nuclear Instruments and Methods in Physics Research, Section A: Accelerators, Spectrometers, Detectors and Associated Equipment, vol. 246, Issues 1-3, May 15, 1986, pp. 517-522. doi:10.1016/0168-9002(86)90143-9.

International Search Report dated Mar. 5, 2018 in connection with International Patent Application No. PCT/US2017/068247, 2 pages.

Written Opinion of the International Searching Authority dated Mar. 5, 2018 in connection with International Patent Application No. PCT/US2017/068247, 3 pages.

\* cited by examiner

SINGLE-STAGE ACTIVE INTEGRATOR WITH MULTIPLICATION OF PHOTODIODE CURRENT

CROSS-REFERENCE TO RELATED APPLICATIONS

This application is a 371 of International Application No. PCT/US2017/068247 filed on Dec. 22, 2017, which claims priority to U.S. Provisional Patent Application No. 62/511,899 filed on May 26, 2017, the disclosures of which are herein incorporated by reference in their entirety.

TECHNICAL FIELD

This disclosure is generally directed to automated payment systems. More specifically, this disclosure is directed to a single-stage active integrator with multiplication of a photodiode current.

BACKGROUND

Commonly used photodiode current integrator circuits have a floating type connection of an integration capacitor and a reset switch. In case of fast integration times, a capacitor must be chosen with a rather small value. For a switch, a field effect transistor (FET) type transistor may be used, must have internal gate source and gate drain capacitances lower than the integration capacitor. This FET must have leakage currents much less than the photodiode current. This narrows a number of applicable switches and limits possible integration speed.

SUMMARY

This disclosure provides a single-stage active integrator with multiplication of photodiode current.

An embodiment of this disclosure provides an automated payment apparatus. The apparatus includes a photodiode current integrator configured to charge an integration capacitor by a multiplied photodiode current. The photodiode current integrator includes a first feedback resistor connected along a negative feedback path of an operational amplifier between an output of the operational amplifier and a negative input of the operational amplifier. The photodiode current integrator also includes a second feedback resistor connected along a positive feedback path of the operational amplifier between the output of the operational amplifier and a positive input of the operational amplifier. The photodiode current integrator also includes the integration capacitor connected to the positive input of the operational amplifier and connected to a common circuit ground. The photodiode current integrator also includes a reset switch connected to the positive input of the operational amplifier. The second lead of the reset switch is connected to common ground or to an additional voltage source. The photodiode current integrator also includes a photodiode connected to the positive input of the operational amplifier and connected to the negative input of the operational amplifier.

Other technical features may be readily apparent to one skilled in the art from the following figures, descriptions, and claims.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1A through 5B, discussed below, and the various embodiments used to describe the principles of the present disclosure in this patent document are by way of illustration only and should not be construed in any way to limit the scope of the disclosure. Those skilled in the art will understand that the principles of this disclosure may be implemented in any suitably arranged device or system.

Photodiode current integration circuits are widely used in different optic devices. There are several purposes of their uses. One purpose is for receiving a proper amplitude of filtered signals for subsequent data acquisition. Also, by changing integration time, it is possible to receive different resultant gains of integration circuits. Photodiode current integrators are also widely used in detection of luminescence decays.

In previous designs, an integration circuit charges an integration capacitor by current equal to a photodiode current. In this case, for receiving proper output signal, after reasonable times of integration, small values of the integration capacitor are used. Parameters of the switch, used for discharging of the integration capacitor, in this case, must meet several requirements. Leakage current of this switch must be much lower than the photodiode current. Also, charge injection in the integration capacitor from the switch must be small. For the switch, where an FET type transistor is used, the gate-source and gate-drain capacitances of this transistor must be significantly lower or at least of the same order as the value of integration capacitor. Only in this case, it is possible to maintain the integrator in an active state after releasing of the switch. The above narrows the choices of acceptable types of switches and, sometimes, limits possible integration speed.

The above described problem could be solved by using a two stage circuit. The first stage is a transimpedance amplifier and the second stage is an integrator of the first stage output voltage. However, for many cases, a one stage solution may be used as the preferable one. Mainly it is for the serving of different photodiode arrays where cheap and compact associated circuits are used.

Figure 1A:
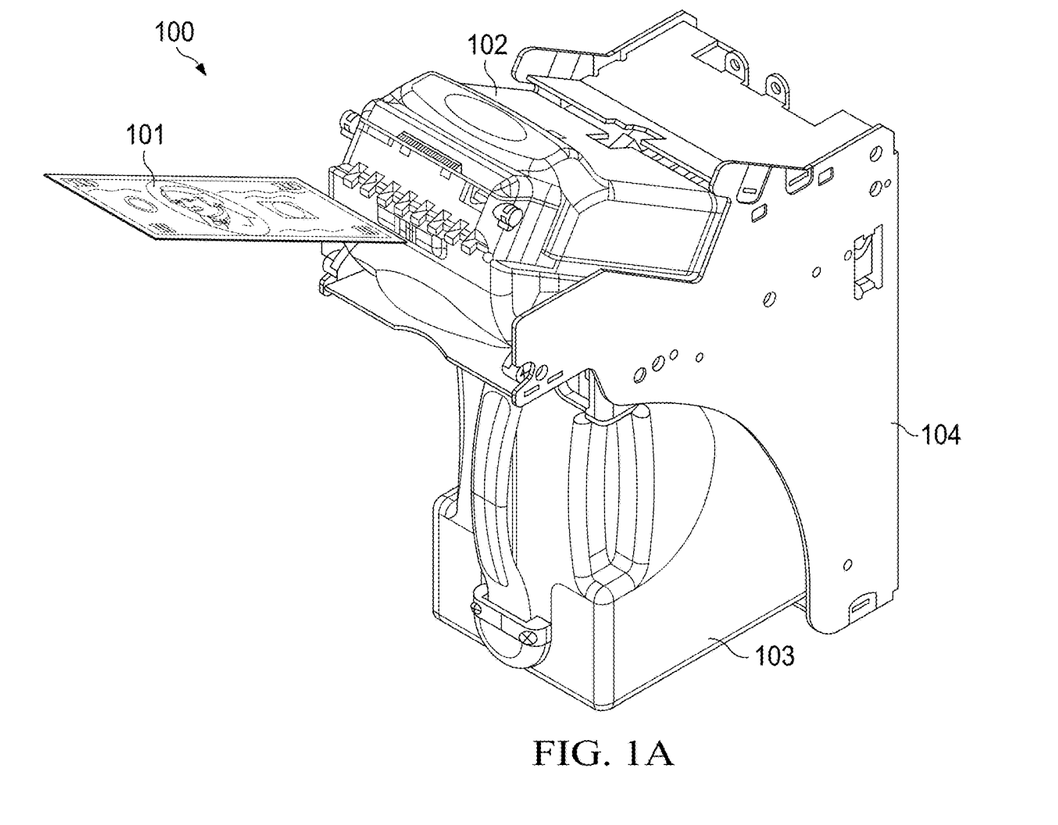
FIG. 1A illustrates a currency handling apparatus according to an embodiment of this disclosure.
Figure 1B:
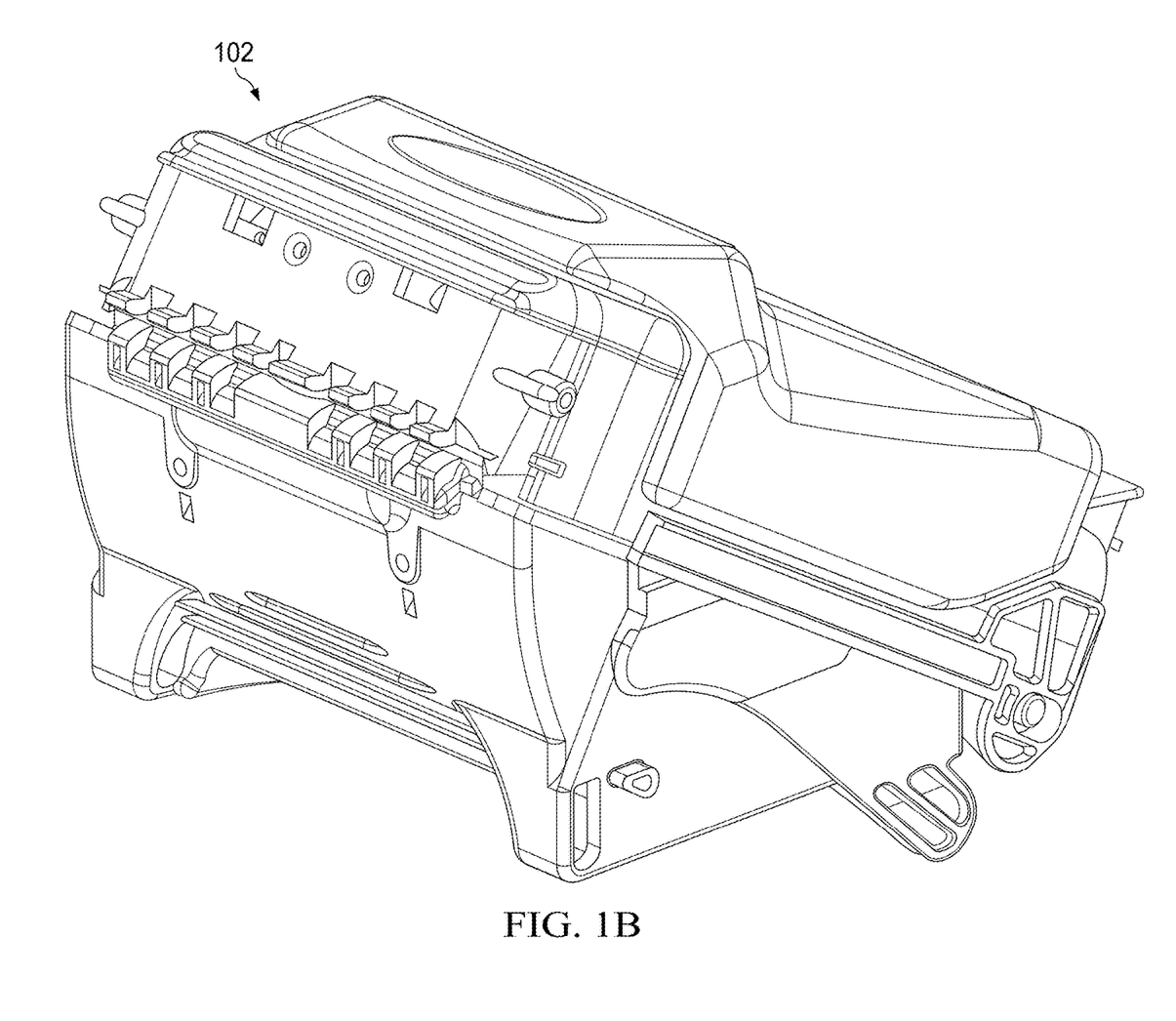
FIG. 1B illustrates a note validator according to an embodiment of this disclosure.

FIGS. 1A and 1B illustrate examples of a currency handling apparatus and note validator according to an embodiment of this disclosure. Currency handling apparatuses and note validators come in a wide variety of configurations, and FIGS. 1A and 1B do not limit the scope of this disclosure to any particular implementation of a currency handling apparatus. Currency handling apparatus 100 can include a single-stage active integrator with multiplication of photodiode current.

As used throughout this specification, the terms currency denomination, denomination of currency, valuable document, currency bill, bill, banknote, note, bank check, paper money, paper currency, coin, coinage, and cash may be used interchangeably herein to refer to a type of a negotiable instrument or any other writing that evidences a right to the payment of a monetary obligation, typically issued by a central banking authority.

The currency handling apparatus 100 includes the note validator 102, a removable storage unit 103, and a chassis 104. In some implementations, note validator 102 is removably coupled to chassis 104. Note validator 102 can be configured to receive a note 101 and transport the currency item past a sensing component to determine the type and validity of note 101. In one or more embodiments, removable storage unit 103 can be a note stack recycler. In some implementations, removable storage unit 103 includes a transportation device for transporting note 101 to and/or from the removable storage unit 103.

Although FIGS. 1A and 1B illustrate one example of a currency handling apparatus 100 and note validator 102, various changes may be made to FIGS. 1A and 1B. For example, the currency handling apparatus 100 could be used in automatic ticket seller machines, automatic teller machines, vending machines and other kiosks. Also, there could be more than one removable storage unit 103 as well as a temporary storage unit, such as a note recycler.

Figure 1C:
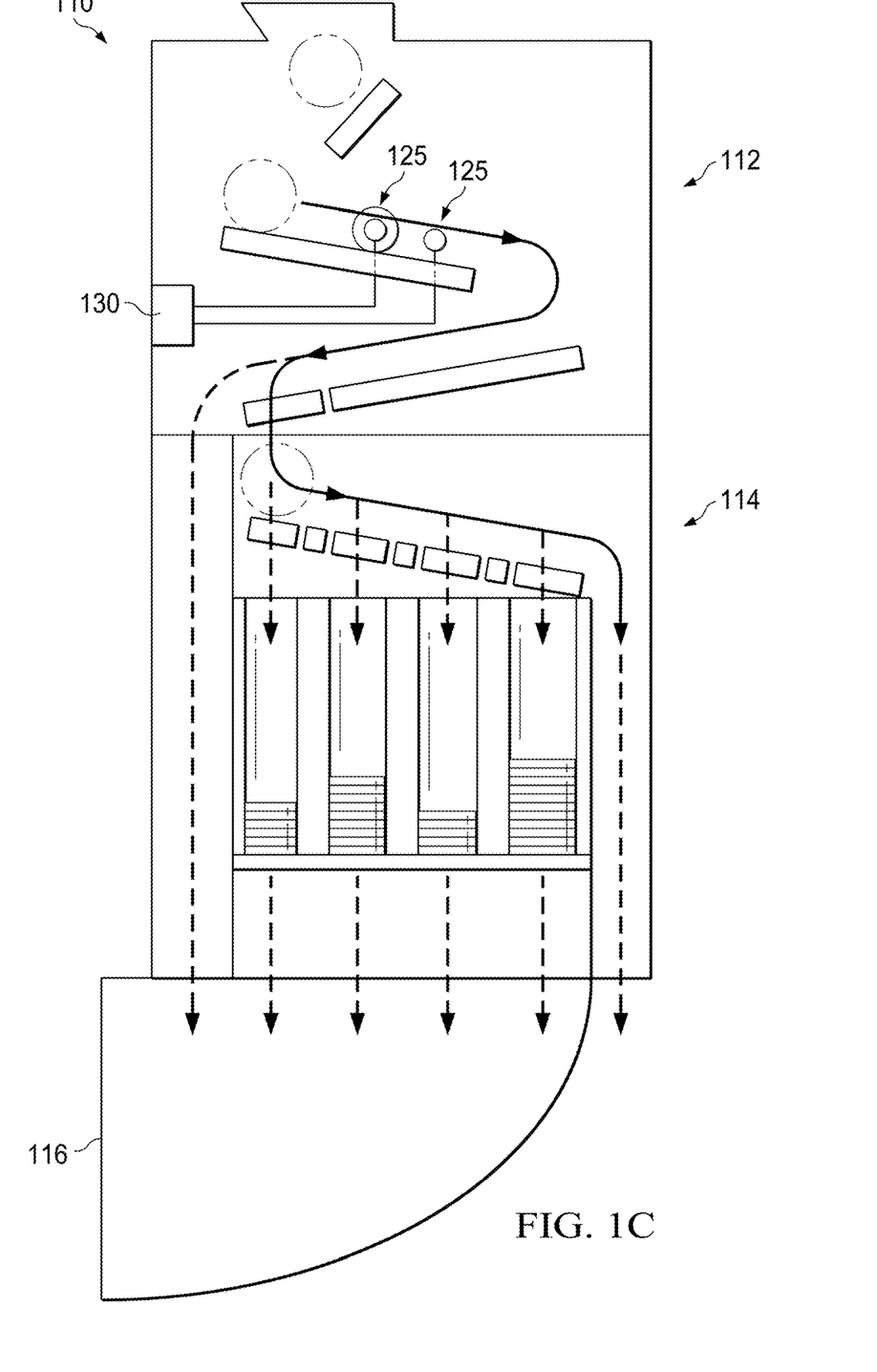
FIG. 1C illustrates a coin validator according to one embodiment of the present disclosure.

FIG. 1C illustrates a coin validator 110 according to one embodiment of the present disclosure. In one illustrative embodiment, coin validator 110 can be part of a coin access mechanism. Additionally, embodiments of this disclosure may be implemented in automatic ticket seller machines, gaming machine, automated payment machine, automatic teller machines, kiosks, and the like, and are not limited to use in only vending machines.

Referring to FIG. 1C, coin validator 110 comprises a coin recognition system 112, a coin separator 114 and a coin storage region 116. The coin validator 110 receives an inserted coin through an opening, which is connected to a payment access mechanism. The coin travels along a ramp in the coin validator 110 past sensors such as those shown at 125.

The sensors 125 generate electrical signals which are provided to a coin mechanism processor 130 such as a microprocessor or microcontroller. The electrical signals generated by the sensors 125 contain information corresponding to the measured characteristics of the coin, such as a coin's diameter, thickness, metal content, and electromagnetic properties. Based on these electrical signals, the coin mechanism processor 130 is able to discriminate whether the coin is acceptable, and if so, the denomination of the coin.

If the coin is unacceptable, the coin mechanism processor 130 controls a gate to direct the unacceptable coin to a reject chute. The reject chute is connected to the coin return recess. In the alternative, acceptable coins are directed to the coin separator 114 by the gate. The coin separator 114 may have a number of gates arranged along a ramp and also controlled by signals from the coin mechanism processor 130, for diverting the coin from the ramp. The coin may be diverted into respective containers, or the coin may be allowed to proceed along the ramp to a path leading to a cash box (not shown).

In one example embodiment, currency handling apparatus 100 uses a single-stage active photodiode current integrator with charging of an integration capacitor by multiplied photodiode current to allow high values of integration capacitor at small values of photodiode currents. The integrator also includes a reset/release switch with a wide range of leakage currents and internal capacitances. When both the integration capacitor and the reset/release switch are connected to ground of the circuit, a switch could be driven by standard logic levels with diminished possibility of noise penetration from driver circuits.

Figure 2:
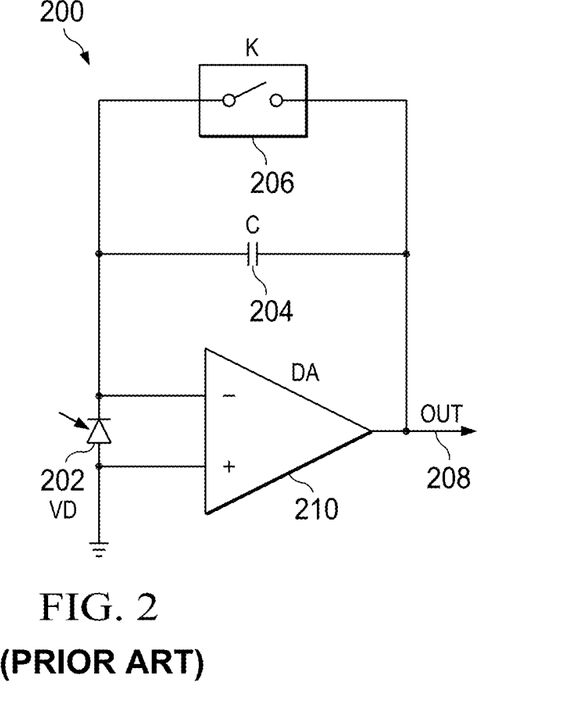
FIG. 2 illustrates a circuit diagram of an active single-stage integrator found in the prior art.

FIG. 2 illustrates a circuit diagram of an active single-stage integrator 200 found in the prior art. For this type of integrator, an anode of photodiode (VD) 202 is terminated to ground (GND) and integration capacitor (C) 204 forms negative feedback of the circuit. Reset/release of this integrator is carried out by switch (K) 206. Output signal (V) 208 of the circuit will be defined by the equation as follows:

$$V = \frac{1}{c}\int_0^T I(t)dt, \tag{1}$$

where T is the time of integrating from the moment when the circuit is released by switch K 206, and I(t) is the time dependence of photodiode current. For using such a circuit, when the photodiode current has small values, small values of integration capacitor C 204 are used. An operational amplifier DA 210 is additionally included. Also, parameters of switch K 206 must comply with several requirements.

For the switch K 206, leakage currents both between the main terminals and also between one or more driving terminals and the main terminals must be low. Also, charge injection to integrator capacitor C 204 must be small when the switch is released. In some embodiments, a FET type transistor may be used as switch K 206. As far as the switch K 206 has a floating connection, both gate-source and gate-drain capacitors will be involved in charge injections. When capacitance of integration capacitor C 204 is rather small, the number of proper FETs that can be used as a switch is narrowed and possible integration capacitor values are limited.

Figure 3:
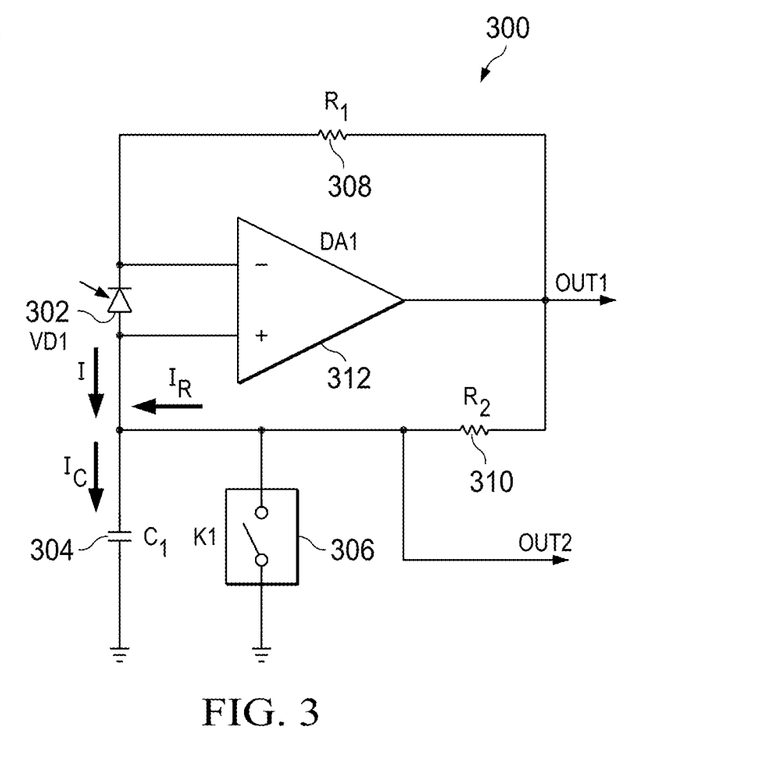
FIG. 3 illustrates a circuit diagram of a single stage integrator of a photodiode current with multiplication of the photodiode current according to an embodiment of this disclosure.

FIG. 3 illustrates a circuit diagram of a single stage integrator 300 of photodiode current with multiplication of photodiode current according to an embodiment of this disclosure. Integrators come in a wide variety of configurations, and FIG. 3 does not limit the scope of this disclosure to any particular implementation of an integrator. The integrator 300 can be part of one of the components as shown in FIGS. 1A-1B.

In FIG. 3, a circuit diagram is provided for a single stage active integrator 300. This circuit is a combination, in single stage, of transimpedance amplifier and active integrator. Integrator 300 uses a floating type connection of photodiode VD1 302 that is tightened to integration capacitor $C_1$ 304. A reset/release switch 306 is tightened to ground.

In one or more examples, the switch 306 could also be connected to a shift voltage source to offset voltage of operational amplifier compensation. In integrator 300, current to integration capacitor $C_1$ 304 comes directly from photodiode current I and from current $I_R$ through resistor $R_2$ 310. $I_R$ can be calculated as follows:

$$I_R = I \times (R_1/R_2) \quad (2)$$

Total charging current $I_c$ could be calculated by equation (3):

$$I_c = I \times [1 + (R_1/R_2)] \quad (3)$$

As it is seen from equation (3), by choosing the ratio of resistors R1 308 and R2 310, the charging current of capacitor $C_1$ 304 can be adjusted. This allows for raising the charging current. In this example, to achieve the same result as circuit in FIG. 2, a larger value of integration for capacitor $C_1$ 304 can be chosen with respect to the value of capacitor C 206 for the circuit in FIG. 2.

One connection to receive an output voltage includes a direct connection to an output of operational amplifier DA1 312 (OUT1) and another connection includes directly connecting to integration capacitor $C_1$ 304 (OUT2). OUT2 output has output impedance equal to $R_2$ 310 and could be used based on input resistance of data acquisition part with respect to $R_2$ 310 (e.g., if the input resistance is high). In one or more example embodiments, a buffer could be used. In this example embodiment, output signal $V_{OUT2}$ from OUT2 can be defined as follows:

$$V_{OUT2} = [1/(C_1+C_D+C_S)] \times [1+(R_1/R_2)] \times \int_0^T I(t)dt \quad (4)$$

where T is a time of integrating from the moment when the circuit is released by switch K1 306, I(t) is time dependence of the photodiode current, and $C_D$ is a common mode capacitance of a direct input of operational amplifier DA1 312. $C_S$ is a capacitance of switch K1 306.

Output signal $V_{OUT1}$ from OUT1 output can be defined as follows:

$$V_{OUT1} = \{[1/(C_1+C_D+C_S)] \times [1+(R_1/R_2)] \times \int_0^T I(t)dt\} + R_1 \times I(T) \quad (5)$$

where T is a time of integrating from the moment when the circuit is released by switch K1 306, I(t) is a time dependence of photodiode current, $C_D$ is a common mode capacitance of a direct input of operational amplifier DA1 312, $C_S$ is a capacitance of K1 306, and I(T) is a photodiode current value at the moment T of an end of the integration cycle.

As it is seen from equation (5), value $V_{OUT1}$ includes, in addition to the integrated value, an additive proportional to the current of photodiode at a moment of data acquisition. In an example, when the additive is small and not noisy, this output can also be used.

Figures 4, 5A, 5B:
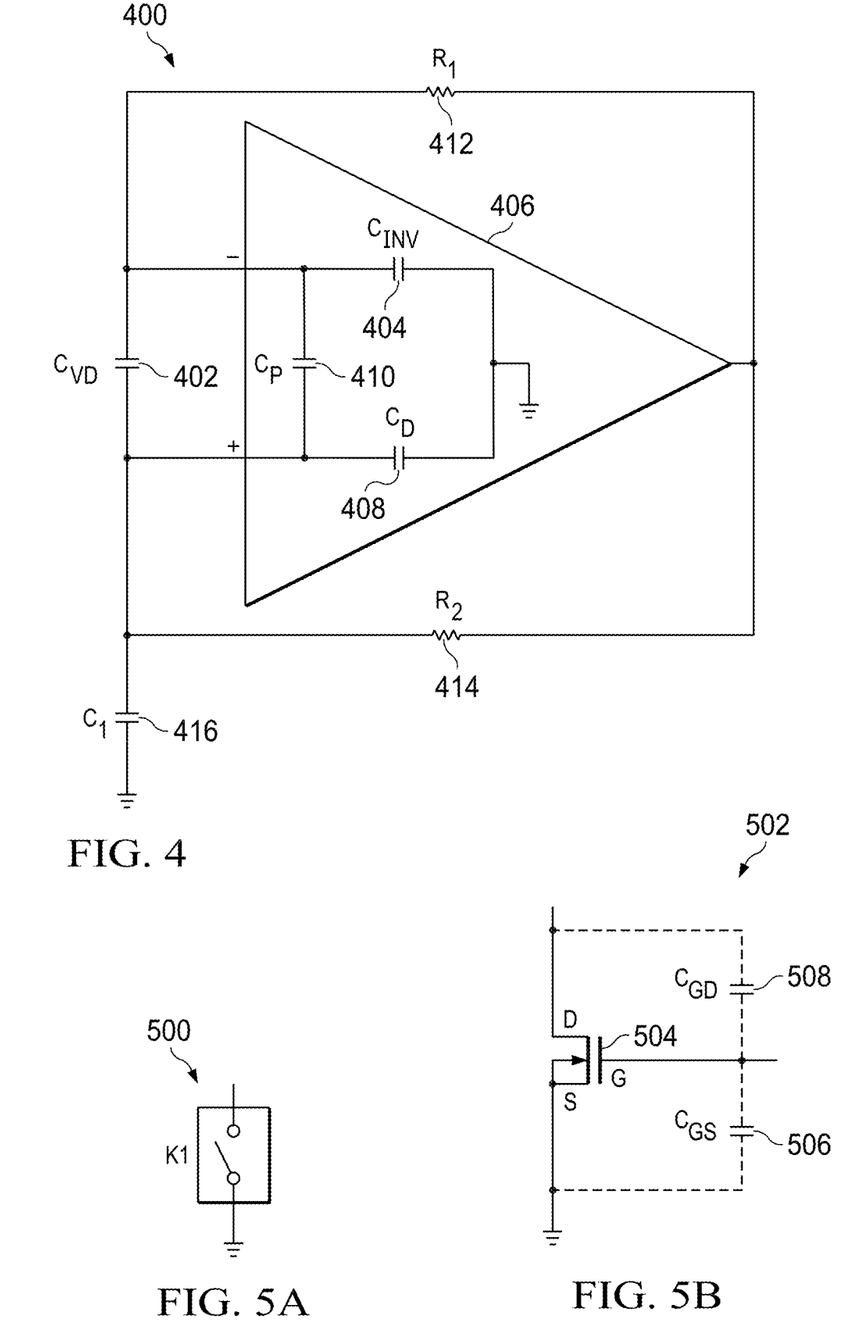
FIG. 4 illustrates a circuit diagram of feedback circuits that impact an integrator's stability according to an embodiment of this disclosure.
FIG. 5A illustrates a circuit diagram of a reset/release switch for an integrator according to an embodiment of this disclosure.
FIG. 5B illustrates a circuit diagram of an FET type reset-release switch according to an embodiment of this disclosure.

FIG. 4 illustrates a circuit diagram of a feedback circuit 400 that can impact the integrator's stability according to an embodiment of this disclosure. Feedback circuits may come in a wide variety of configurations, and FIG. 4 does not limit the scope of this disclosure to any particular implementation of a feedback circuit. The feedback circuit 400 can be part of one of the components as shown in FIGS. 1A-1B.

FIG. 4 illustrates an equivalent circuit diagram for both negative and positive feedbacks with all potential capacitances which can impact the integrator's stability. In FIG. 4, there are shown a photodiode capacitor ($C_{VD}$) 402, a common mode capacitor ($C_{INV}$) 404 of an inverting input of an operational amplifier 406, a common mode capacitor ($C_D$) 408 of a direct input of the operational amplifier 402, and a differential capacitor ($C_P$) 410 between the inverting and direct inputs of the operational amplifier 402. Capacitance of switch $C_S$ is not shown in FIG. 4, as its value is an additive to the capacitance of C1.

In one example embodiment, feedback circuit 400 forms a bridge type circuit. A first arm of the bridge circuit is formed by resistor R1 412 and common mode capacitor $C_{INV}$ 404. A second arm of this bridge is formed by resistor R2 414 and a capacitor formed from being connected in parallel, capacitor ($C_1$) 416, switch capacitance ($C_S$) and common mode capacitor $C_D$ 408. A diagonal load of this bridge circuit is formed by photodiode capacitor $C_{VD}$ 402 and differential capacitor $C_P$ 410 connected in parallel. For stable operation, negative feedback leads with respect to positive feedback. An equation for a border of stability could be received from a condition of a fully balanced bridge as follows:

$$R_1 \times C_{INV} = R_2 \times (C_1+C_D+C_S) \quad (6)$$

If equation (6) is fulfilled, the integrator will be in an indifferent equilibrium state. Any operational amplifier output voltage change will result in common mode signals only on its inputs. For stable operation, the next inequality is fulfilled as follows:

$$R_1 \times C_{INV} < R_2 \times (C_1+C_D+C_S) \quad (7)$$

In this example, negative feedback will lead with respect to positive feedback. Capacitances of the photodiode and differential input capacitances of the operational amplifier 406 has no impact on stability. In stable operation, the operational amplifier 406 maintains constant voltage difference between inputs (equal to the operational amplifier's offset voltage). In this example, any charge/discharge current flows through the photodiode and differential input capacitors and, as a result, these capacitances have no impact on stability.

FIG. 5A illustrates a reset/release switch 500 for the integrator 300 as shown in FIG. 3. Switches come in a wide variety of configurations, and FIG. 5A does not limit the scope of this disclosure to any particular implementation of a switch. The switch can be part of one of the components as shown in FIGS. 1A-1C.

FIG. 5B illustrates a circuit diagram of a circuit 502 including an FET type of reset-release switch 504. Switches come in a wide variety of configurations, and FIG. 5B does not limit the scope of this disclosure to any particular implementation of a switch. The switch can be part of one of the components as shown in FIGS. 1A-1C. Internal gate-source ($C_{GS}$) 506 and gate-drain ($C_{GD}$ 508 capacitances of the switch 504 are illustrated in circuit 502.

In one embodiment, for small values of resistor R2 310 and large values of capacitor $C_1$ 304, the leakage current requirements for switch K1 306 are reduced, in comparison to requirements for switch K 208 as shown in FIG. 2. For integrator 200 shown in FIG. 2, switch K 208 has lower leakage current than the photodiode current. Switch K1 306 can have a leakage current value that is lower than $[1+(R_1/R_2)]$ multiplied by the photodiode current.

Integrator 300 shown on FIG. 3 provides the use of switches with rather large values of internal gate-source and gate-drain capacitances due to a possibility of the integration capacitor value rising. Moreover, for integrator 300 in FIG. 3, in case of a FET type switch, only gate-drain capacitance is involved in charge injection. In one or more embodiments, switches other than FET types may be used.

In one or more example embodiments, integrator 300 as shown in FIG. 3 provides a connection to ground of both the integration capacitor $C_1$ 304 and the reset/release switch 306. This allows the switch to be driven by standard logic levels with diminished possibility of noise penetration from driver circuits.

In some embodiments, various functions described in this patent documents are implemented or supported by a computer program.

One or more embodiments provide an apparatus including a photodiode current integrator with charging of integration capacitor by multiplied photodiode current. The integrator includes a first feedback resistor, a second feedback resistor, an integration capacitor, a reset switch, and a photodiode.

In one or more of the above examples, the first feedback resistor is connected along a negative feedback path of an operational amplifier between an output of the operational amplifier and a negative input of the operational amplifier.

In one or more of the above examples, the second feedback resistor is connected along a positive feedback path of the operational amplifier between the output of the operational amplifier and a positive input of the operational amplifier.

In one or more of the above examples, the integration capacitor has a first capacitor lead connected to the positive input of operational amplifier and a second lead connected to a common circuit ground.

In one or more of the above examples, the reset switch includes a first switch lead connected to the positive input of the operational amplifier In one or more of the above examples, the photodiode includes a first photodiode lead connected to the positive input of the operational amplifier and a second photodiode lead connected to the negative input of operational amplifier.

In one or more of the above examples, the reset switch further includes a second switch lead connected to the common circuit ground.

In one or more of the above examples, the reset switch further includes a second switch lead connected to an additional voltage source.

One or more embodiments provide an automated payment apparatus including a photodiode current integrator configured to charge an integration capacitor by a multiplied photodiode current, including a first feedback resistor connected along a negative feedback path of an operational amplifier between an output of the operational amplifier and a negative input of the operational amplifier, a second feedback resistor connected along a positive feedback path of the operational amplifier between the output of the operational amplifier and a positive input of the operational amplifier, the integration capacitor connected to the positive input of the operational amplifier and connected to a common circuit ground, a reset switch connected to the positive input of the operational amplifier, and a photodiode connected to the positive input of the operational amplifier and connected to the negative input of the operational amplifier.

In one or more of the above examples, the reset switch is further connected to the common circuit ground.

In one or more of the above examples, the reset switch is further connected to an additional voltage source.

In one or more of the above examples, the reset switch is a field effect transistor type switch.

In one or more of the above examples, the photodiode current integrator operates when a leakage current of the reset switch is more than the photodiode current.

In one or more of the above examples, a charging current of the integration capacitor is adjusted by determining a ratio of a resistance of the negative feedback resistor to a resistance of the positive feedback resistor.

In one or more of the above examples, a stable operation state of the photodiode current integrator occurs when a time constant of the negative feedback path is less than a time constant of the positive feedback path.

In one or more of the above examples, the photodiode current integrator further includes a second lead of the integration capacitor is connected to common circuit ground.

In one or more of the above examples, the photodiode current integrator further includes a second lead of the reset switch is connected to common circuit ground.

In one or more of the above examples, the photodiode current integrator further includes a second lead of the reset switch is connected to an additional voltage source.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," system," "processor," or "controller" within a claim is understood and intended to refer to structure known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An automated payment apparatus comprising:
    a photodiode current integrator configured to charge an integration capacitor by a multiplied photodiode current, including:
        a first feedback resistor connected along a negative feedback path of an operational amplifier between an output of the operational amplifier and a negative input of the operational amplifier;
        a second feedback resistor connected along a positive feedback path of the operational amplifier between the output of the operational amplifier and a positive input of the operational amplifier;
        the integration capacitor connected to the positive input of the operational amplifier;

a reset switch connected to the positive input of the operational amplifier; and a photodiode connected to the positive input of the operational amplifier and connected to the negative input of the operational amplifier.

2. The automated payment apparatus of claim 1, wherein the reset switch is further connected to common circuit ground.

3. The automated payment apparatus of claim 2, wherein a leakage current of the reset switch is more than the photodiode current.

4. The automated payment apparatus of claim 3, wherein a charging current of the integration capacitor is adjusted by determining a ratio of a resistance of the first feedback resistor to a resistance of the second feedback resistor.

5. The automated payment apparatus of claim 4, wherein a stable operation state of the photodiode current integrator occurs when a time constant of the negative feedback path is less than a time constant of the positive feedback path.

6. The automated payment apparatus of claim 5, wherein the photodiode current integrator further includes a second lead of the integration capacitor connected to common circuit ground.

7. The automated payment apparatus of claim 1, wherein the photodiode current integrator further includes a second lead of the reset switch connected to an additional voltage source.

8. The automated payment apparatus of claim 1, wherein the reset switch is further connected to an additional voltage source.

9. The automated payment apparatus of claim 8, wherein a leakage current of the reset switch is more than the photodiode current.

10. The automated payment apparatus of claim 9, wherein a charging current of the integration capacitor is adjusted by determining a ratio of a resistance of the first feedback resistor to a resistance of the second feedback resistor.

11. The automated payment apparatus of claim 10, wherein a stable operation state of the photodiode current integrator occurs when a time constant of the negative feedback path is less than a time constant of the positive feedback path.

12. The automated payment apparatus of claim 11, wherein the photodiode current integrator further includes a second lead of the integration capacitor connected to common circuit ground.

13. The automated payment apparatus of claim 11, wherein the photodiode current integrator further includes an output of the integration capacitor, wherein the output of the integration capacitor has an impedance equal to the second feedback resistor, and wherein the output of the operational amplifier has an impedance equal to the first feedback resistor.

14. The automated payment apparatus of claim 1, wherein the reset switch is a field effect transistor type switch.

15. The automated payment apparatus of claim 1, wherein a leakage current of the reset switch is more than the photodiode current.

16. The automated payment apparatus of claim 1, wherein a charging current of the integration capacitor is adjusted by determining a ratio of a resistance of the first feedback resistor to a resistance of the second feedback resistor.

17. The automated payment apparatus of claim 1, wherein a stable operation state of the photodiode current integrator occurs when a time constant of the negative feedback path is less than a time constant of the positive feedback path.

18. The automated payment apparatus of claim 1, wherein the photodiode current integrator further includes a second lead of the integration capacitor connected to common circuit ground.

19. The automated payment apparatus of claim 1, wherein the photodiode current integrator further includes an output of the integration capacitor and wherein the output of the integration capacitor has an impedance equal to the second feedback resistor.

20. The automated payment apparatus of claim 19, wherein the output of the operational amplifier has an impedance equal to the first feedback resistor.

* * * * *